(12) United States Patent
Jeong

(10) Patent No.: US 6,907,084 B2
(45) Date of Patent: Jun. 14, 2005

(54) METHOD AND APPARATUS FOR PROCESSING MODULATION SYMBOLS FOR SOFT INPUT DECODERS

(75) Inventor: Gibong Jeong, Stanford, CA (US)

(73) Assignee: Texas Instruments Incorporated, Dallas, TX (US)

( * ) Notice: Subject to any disclaimer, the term of this patent is extended or adjusted under 35 U.S.C. 154(b) by 725 days.

(21) Appl. No.: 09/947,251

(22) Filed: Sep. 5, 2001

(65) Prior Publication Data

US 2002/0067777 A1 Jun. 6, 2002

Related U.S. Application Data

(60) Provisional application No. 60/238,801, filed on Oct. 6, 2000.

(51) Int. Cl.[7] ................................. H04L 5/12
(52) U.S. Cl. ...................... 375/261; 714/794
(58) Field of Search ................. 375/261, 262, 375/264, 265, 341; 714/786, 791, 792, 794, 795, 796

(56) References Cited

U.S. PATENT DOCUMENTS

| | | | |
|---|---|---|---|
| 6,078,626 A | | 6/2000 | Ramesh |
| 6,473,878 B1 | * | 10/2002 | Wei ........................ 714/755 |
| 6,476,734 B2 | * | 11/2002 | Jeong et al. ................ 341/50 |
| 6,798,846 B2 | * | 9/2004 | Golitschek Edler Von Elbwart et al. ....................... 375/298 |
| 6,834,088 B2 | * | 12/2004 | Agami et al. ............... 375/324 |

OTHER PUBLICATIONS

"Implementation and Performance of a Turbo/Map Decoder", Pletrobon, S.S., International Journal of Satellite Communications, John Wiley & Son, US, vol. 16, No. 1, 1998, pp. 23–46, XP000856961, ISSN:0737–2884.

"Turbo–codes and High Spectral Efficiency Modulation", Le Goff S. et al., Communications, 1994. ICC '94, Supercomm/ ICC 94, Conference Record, Serving Humanity Through Communications. IEEE International Conference on New Orleans, LA, USA May 1–5, 1994, New York, NY, USA, IEEE, May 1, 1994, pp. 645–649, XP010126658, ISBN: 0–7803–1825–0.

* cited by examiner

*Primary Examiner*—Dac V. Ha
(74) *Attorney, Agent, or Firm*—Ronald O. Neerings; Wade James Brady, III; Frederick J. Telecky, Jr.

(57) ABSTRACT

A method and apparatus for processing modulation symbols for soft input decoders using an efficient method of calculating an accurate log-likelihood ratio without relying on approximations is described. In contrast to other techniques that calculate distance metrics based on the individual constellation points, the method of the invention analyzes distances based on different groupings of points, where a given group (e.g., one of the $II_{+k}$ or $II_{-k}$ sets) is defined by the same bit (1 or 0) in the same bit position. A recursive scheme is preferably used where previous computations are saved and used for subsequent computations or iterations and the decoupled processing of real and imaginary components associated with the I and Q components.

13 Claims, 2 Drawing Sheets

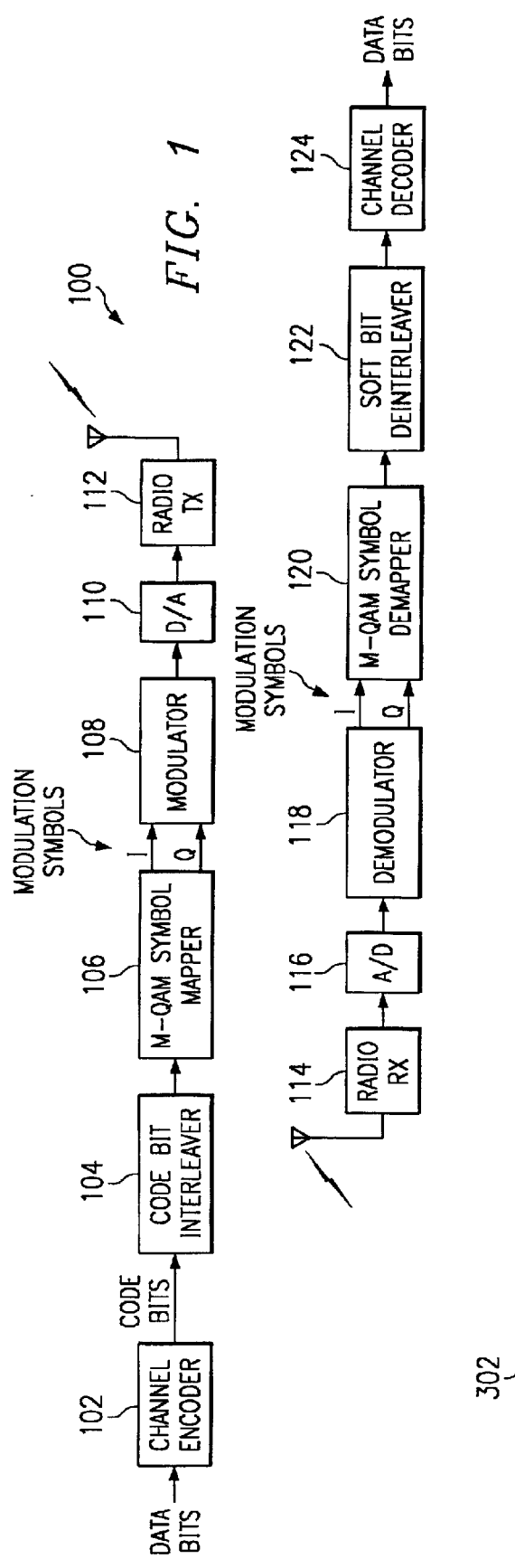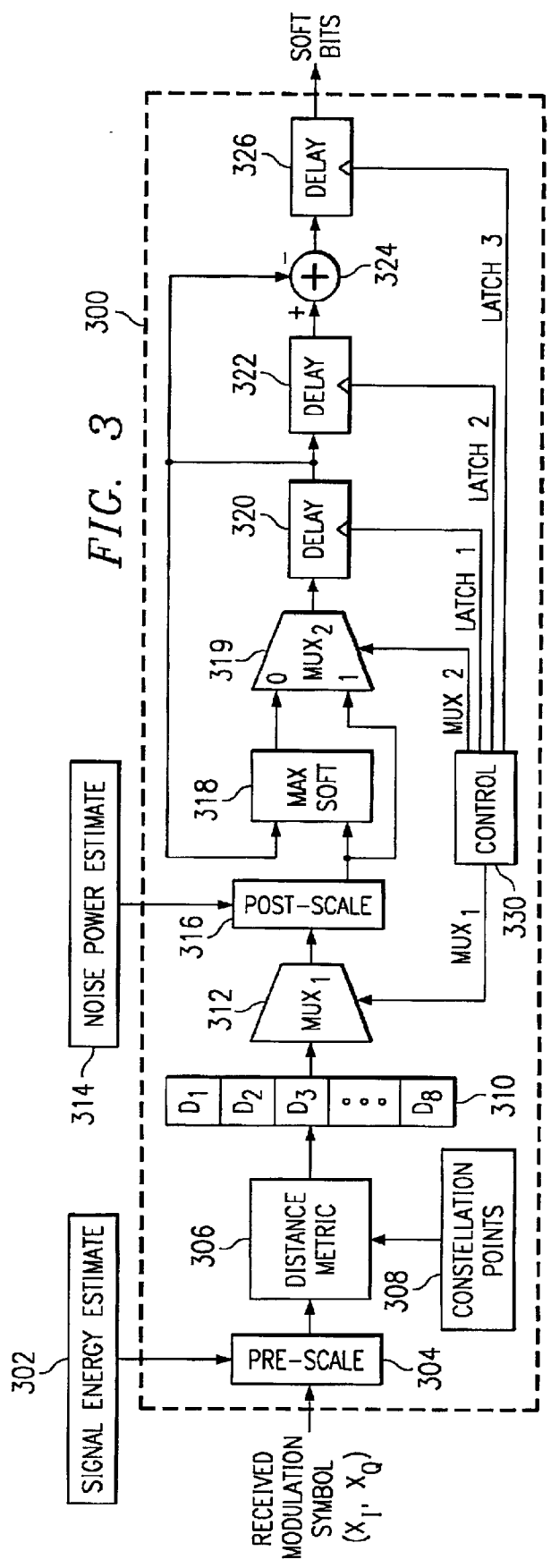

METHOD AND APPARATUS FOR PROCESSING MODULATION SYMBOLS FOR SOFT INPUT DECODERS

This application claims priority under 35 USC §119(e)(1) of provisional application Ser. No. 60/238,801, filed Oct. 6, 2000.

FIELD OF THE INVENTION

The present invention relates generally to data communication systems. More particularly, the present invention relates to a modulation symbol demapping technique that generates soft bits for processing by a soft input decoder.

BACKGROUND OF THE INVENTION

Modern communication systems provide higher rates of data transmission through the use of multiple-level modulation such as M-ary quadrature amplitude modulation (QAM). Although soft input decoders are preferable in many communication systems, most soft input decoders are designed for binary modulation, i.e., a soft bit instead of a multiple-level code symbol. Thus, a method and apparatus for efficiently converting a multiple-level modulation symbol to multiple soft bit inputs for decoders by taking advantage of the inherent structure of such conversion is needed which will provide for better decoder performance and less hardware complexity.

In the prior art, multiple level modulation and coding schemes are jointly and integrally designed such that one modulation symbol can generate a single branch metric for a soft input decoder rather than producing multiple soft bits that can be individually processed. Among these techniques are trellis coded modulation (TCM) and turbo trellis modulation. Unfortunately, such direct conversion of modulation symbol to code symbol is not desirable in most wireless communication systems that require an interleaver between the modulation symbol demapper and the channel encoder as shown in FIG. 1. Since in wireless communication systems a fading channel often causes burst errors, the output of the channel encoder should be interleaved before being mapped to modulation symbols. This requires the receiver to decompose a modulation symbol into multiple soft input bits so that the soft bits may be deinterleaved and inputted to the decoder as shown in FIG. 1.

The following example is described in the context of the specific Gray-coded 64-QAM constellation shown in FIG. 2. The example illustrates a prior art technique for converting a received modulation symbol to multiple soft bits.

Each point of the 64-QAM constellation is represented by two real numbers $(C_{Ii}, C_{Qi})$ i=1, ..., 64 and corresponds to input data bits $b_0 b_1 \ldots b_5$. In additive white Gaussian noise channels, it is known that the following log-likelihood ratio produces the optimal conversion from a received modulation symbol $(X_I, X_q)$ to soft bit inputs $b_k$ k=0, ..., 5 for use with soft input decoders.

$$b_k = \log \frac{\sum_{i \in S_{+k}} \exp\left(-\frac{(X_I - c_{Ii})^2}{2\sigma^2} - \frac{(X_Q - c_{Qi})^2}{2\sigma^2}\right)}{\sum_{j \in S_{-k}} \exp\left(-\frac{(X_I - c_{Ij})^2}{2\sigma^2} - \frac{(X_Q - c_{Qj})^2}{2\sigma^2}\right)} \quad \text{Equation (1)}$$

Here, $\sigma^2$ is the noise variance associated with the channel, exp( ) is the exponential function, log( ) is the natural logarithmic function, $S_{+k}$ and $S_{-k}$ are the sets of thirty two constellation points corresponding to the case when the transmitted bit $b_k$ is 0 and the case when the transmitted bit is 1, respectively. In the context of a practical communication system, the received modulation symbol quantities $(X_I, X_q)$ are obtained by the receiver section, the channel noise is estimated by the receiver section, and the values of c and the modulation symbol constellation are predetermined and known by the receiver section a priori. This log-likelihood ratio calculation requires a significant amount of computation; the complexity of this calculation makes it impractical for use with actual communication systems. To avoid this computation problem, two conventional approximation schmes have been developed: the nearest neighbor Euclidean distance calculation and the progressive decision technique. First, the nearest neighbor Euclidean distance calculation approximates the log likelihood ratio by the following equation:

$$b_k = \frac{1}{2\sigma^2} \left[ \min_{i \in S_{-k}} \{(X_I - c_{Ii})^2 + (X_Q - c_{Qi})^2\} - \min_{j \in S_{+k}} \{(X_I - c_{Ij})^2 + (X_Q - c_{Qj})^2\} \right] \quad \text{Equation (2)}$$

In Equation 2, min { } is the minimum function.

The second method further approximates the exact log-likelihood calculation by decoupling the real and imaginary components $(X_I, X_q)$ of the modulation symbol and making a plurality of progressive soft decisions, as follows:

$b_0 = \text{abs}(X_I)$ $b_1 = \text{abs}(X_Q)$ $b_2 = \text{abs}(b_0) - D_1$ $b_3 = \text{abs}(b_1) - D_1$ $b_4 = \text{abs}(b_2) - D_2$ $b_0 = \text{abs}(b_3) - D_2$ \quad Equation (3)

In the above expressions, abs( ) is the absolute value function and $D_1$ and $D_2$ are specified decision boundaries (for example, 0.617 and 0.308, respectively).

The above-mentioned methods suffer from either excessive computation or performance loss. In other words, although the approximation techniques may be easier to implement, the resulting decoder performance suffers.

BRIEF SUMMARY OF THE INVENTION

The present invention provides an efficient method of calculating an accurate log-likelihood ratio without relying on approximations. The techniques of the present invention may be easily implemented in a practical demapper architecture. The present invention may be utilized in the context of a wireless communication system to provide enhanced decoder performance without a significant increase in computational complexity.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 is a schematic representation of an example wireless communication system in which the techniques of the present invention may be implemented;

FIG. 3 is a schematic representation of a symbol demapper configured in accordance with the present invention.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, digital signal processing elements, logic elements, look-up tables, and the like, which may carry out a variety of functions under the control of one or more microprocessors or other control devices. In addition, those skilled in the art will appreciate that the present invention may be practiced in conjunction with any number of data transmission protocols and that the system described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional techniques for signal processing, data transmission, signaling, network control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

FIG. 1 is a schematic representation of a typical wireless communication system 100 in which the techniques of the present invention may be implemented. It should be appreciated that the present invention can be utilized in the context of any digital data communication system (wireless or otherwise) and that the wireless context is merely one specific application. Generally, communication system 100 processes information data bits, transmits an analog representation of the information bits via a wireless channel, e.g., a radio channel, and extracts the information data bits from the received analog signal. Communication system 100 includes a channel encoder 102 configured to encode the information data bits in accordance with any suitable technique. For example, channel encoder 102 may introduce redundant bits to the input data in accordance with any number of known techniques. The output of the channel encoder 102 may be referred to as a sequence of code bits or code symbols.

Figure 2:
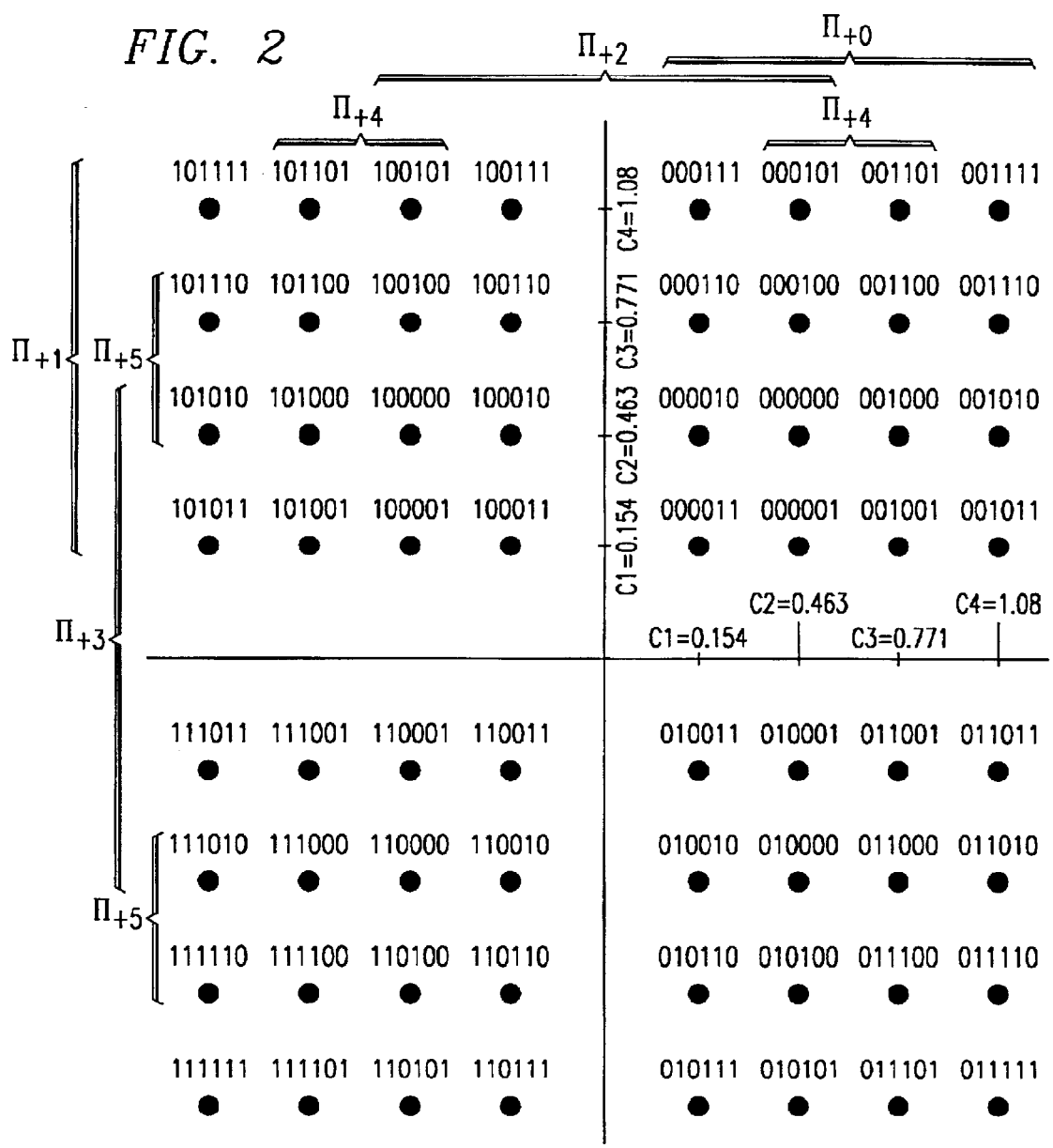
FIG. 2 is a diagram of an example 64 point QAM modulation symbol constellation.

A code bit interleaver 104 processes the code bits. Interleaver 104 may be a block interleaver, a convolutional interleaver, or the like. Interleaver 104 rearranges, reorders, or spreads the code bits in a manner that enables the communication system 100 to better handle burst errors. The digital output of the interleaver 104 is processed by a symbol mapper 106. In the context of this example, symbol mapper 106 is a 64-QAM symbol mapper that utilizes the constellation shown in FIG. 2. Of course, the present invention can be utilized with different modulation schemes, e.g., phase-shift keying (PSK), M-ary QAM, M-PSK, or the like. The constellation of FIG. 2 uses eight different levels or values associated with the I component and the same levels associated with the Q component. Four of the levels are positive values and the remaining four are the corresponding negative values. In FIG. 2, these values are designated as $c_1=0.154$, $c_2=0.463$, $c_3=0.771$, and $c_4=1.080$ (with positive and negative signs). In accordance with known methodologies, the values are selected such that the total transmit power associated with the symbol constellation is equal to one.

In accordance with known QAM techniques, symbol mapper 106 maps six input bits to I and Q component values according to the modulation symbol constellation. The symbol mapper 106 uses six bits as an input because six bits are necessary to uniquely identify 64 different constellation points. For each six-bit input, the symbol mapper 106 generates an I output having one of the eight different values and a Q output having one of the eight different values. In a practical embodiment, the symbol mapper produces multiple-bit words that represent the different I and Q output values.

A modulator element 108 modulates the I and Q components (one at a time) according to any conventional modulation scheme. For example, modulator element 108 may employ CDMA, TDMA, or the like; the present invention is not limited to any particular modulation scheme. After modulation element 108 suitably modulates the I and Q components, a digital-to-analog converter 110 transforms the digital output of the modulator element 108 into an analog form. Thereafter, the analog signal is suitably processed and transmitted by a radio transmitter component 112.

The transmitted signal passes through the air channel and is eventually received by a radio receiver component 114. The receiver component 114 processes the received analog signal and generates an analog signal that is converted by an analog-to-digital converter 116. A demodulator element 118 demodulates the resultant digital signal in accordance with the original modulation scheme. In other words, demodulator 118 "reverses" the modulation procedure and produces corresponding I and Q components, as shown in FIG. 1. It should be noted that the transmitting section or branch, receiver component 114, analog-to-digital converter 116, and demodulator element 118 may all be configured in accordance with known and conventional techniques. Accordingly, the specific configuration and operation of these components and processing elements are not described in detail herein.

The demodulated I and Q components (each of which may be represented by a multiple-bit digital word) are preferably processed by a symbol demapper 120 in a serial manner, i.e., symbol demapper alternately processes the I and Q components. Demapper 120 is preferably configured to perform the reverse mapping operation of symbol mapper 106. However, rather than perform hard decisions to generate hard output bits, symbol demapper 120 is suitably configured to generate soft bits associated with the original code bits. Each soft bit may be represented by a multiple-bit digital word such that the soft bit is capable of conveying information beyond the mere indication of a logical 1 or a logical 0. For example, in the preferred embodiment, each soft bit represents a probability of whether that particular bit originated as a logic 1 or a logic 0; a relatively low soft bit value may indicate a higher probability of a logic 0 while a relatively high soft bit value may indicate a higher probability of a logic 1. In the practical embodiment described herein, symbol demapper 120 generates six soft bits for each six-bit input (resulting in one soft bit per input bit) associated with symbol mapper 106. Thus, symbol demapper 120 generates six soft bits for each combination of I and Q components. The specific operation of symbol demapper 120 is described in more detail below.

The output of symbol demapper 120 (a sequence of soft bits or digital words) is processed by a deinterleaver 122. Deinterleaver 122 is configured to perform the reverse operation of interleaver 104. However, deinterleaver 122 is suitably configured to operate on soft bits rather than on hard bits. Such soft bit deinterleavers are known and communication system 100 may employ any appropriate soft bit deinterleaver design. The output of deinterleaver 122, which is a reordered sequence of soft bits, is presented to a channel decoder 124. Channel decoder 124 is suitably configured to perform the reverse operation associated with channel encoder 102 to thereby extract the original data (in practice, the original data may be corrupted by bit errors) from the sequence of soft bits. In addition, channel decoder 124 is suitably configured to process the soft bit information in an intelligent manner and to generate decisions based upon one or more functional criteria. In other words, channel decoder 124 analyzes each soft bit and determines whether to generate a logical 1 or a logical 0 in response to each soft bit. In this respect, channel decoder 124 and symbol demapper 120 are designed in a cooperative manner such that channel decoder 124 can process the soft bits in a manner consistent with the technique used by symbol demapper 120.

It should be appreciated that certain aspects related to the generation of a soft bit output, the deinterleaving of a sequence of soft bits, and the decoding of soft bits are generally known to those skilled in the art. Consequently, the communication system 100 may leverage any number of known methodologies for use in connection with symbol demapper 120, deinterleaver 122, and/or channel decoder 124. For the sake of clarity and brevity, conventional aspects of these components are not described in detail herein.

The invention proposes an efficient method of calculating soft bits with an accurate log-likelihood ratio without relying on approximations, e.g., the nearest neighbor approximation. In a practical implementation, the soft bit calculation scheme is performed by symbol demapper 120. FIG. 3 is a schematic representation of an exemplary symbol demapper 300 that may be utilized in communication system 100. Demapper 300 is configured to carry out the soft bit calculation techniques of the present invention.

In lieu of the exact log-likelihood ration calculation discussed above (see Equation 1), the present invention utilizes a practical and efficient technique without sacrificing decoder performance. In this respect, the present invention employs a recursive scheme (where previous computations are saved and used for subsequent computations or iterations) and the decoupled processing of real and imaginary components. Equation 1 can be rewritten as follows:

In contrast to Equation 1, which uses $S_{+k}$ and $S_{-k}$ to represent combined sets of constellation points, Equation 4 uses $\Pi_{+k}$ and $\Pi_{-k}$ to represent decoupled sets of constellation points associated with the I and Q components. In addition, in Equation 4, $D_{Ip}$ and $D_{Qp}$ represent a distance metric, measurement, or calculation associated with the distance between the received modulation symbol and a grid or group of points in the given constellation. The different distance expressions in Equation 4 relate to the I and Q components of the received modulation symbol. When k=0, 2, or 4, Equation 4 yields a result associated with the I component; when k=1, 3, or 5, Equation 4 yields a result associated with the Q component. The present invention is not restricted or limited to any specific distance metric. For example, the present invention may utilize a Euclidean distance measurement, an absolute value measurement, a Hamming distance measurement, or the like.

For the example described herein, a total of eight grids is divided into two sets of $\Pi_{+k}$ and $\Pi_{-k}$ for each soft input bit $b_k$ as shown in FIG. 2 and in Table 1. As shown in FIG. 2, each of the constellation points represented by $\Pi_{+0}$ is associated with an input word having a logical zero at the bo position. Constellation points not represented by $\Pi_{+0}$ (i.e., those points represented by $\Pi_0$) are associated with input words having logical ones at the bo position. As illustrated in Table 1, the mapping values associated with the $\Pi_{+0}$ set are $c_1$, $c_2$, $c_3$, and $c_4$. The entire constellation can be represented in this manner.

TABLE 1

Constellation Grid Partition For Each Soft Input Bit

| k | $\Pi_{+k}$ | | | | $\Pi_{-k}$ | | | |
|---|---|---|---|---|---|---|---|---|
| 0, 1 | $+c_1$ | $+c_2$ | $+c_3$ | $+c_4$ | $-c_1$ | $-c_2$ | $-c_3$ | $-c_4$ |
| 2, 3 | $+c_1$ | $-c_1$ | $+c_2$ | $-c_2$ | $+c_3$ | $-c_3$ | $+c_4$ | $-c_4$ |
| 4, 5 | $+c_2$ | $-c_2$ | $+c_3$ | $-c_3$ | $+c_1$ | $-c_1$ | $+c_4$ | $-c_4$ |

In accordance with this representation, the grids $G_1$–$G_8$ correspond to the different values of c as follows:

$G_1 = -c_4$
$G_2 = -c_3$
$G_3 = -c_2$
$G_4 = -c_1$
$G_5 = c_1$
$G_6 = c_2$
$G_7 = c_3$
$G_8 = c_4$

In contrast to other techniques that calculate distance metrics based on the individual constellation points, the present invention analyzes distances based on different groupings of points, where a given group (e.g., one of the $\Pi_{+k}$ or $\Pi_{-k}$ sets) is defined by the same bit (1 or 0) in the same bit position. In accordance with one preferred embodiment, the Euclidean distance between the received modulation symbol and each of eight constellation grids ($G_p$, p=1, ... ,8) is given by:

$$b_k = \begin{cases} \log \sum_{G_p \in \Pi_{+k}} \exp\left(-\frac{D_{Ip}}{2\sigma^2}\right) - \log \sum_{G_q \in \Pi_{-k}} \exp\left(-\frac{D_{Iq}}{2\sigma^2}\right) & k = 0, 2, 4 \\ \log \sum_{G_p \in \Pi_{+k}} \exp\left(-\frac{D_{Qp}}{2\sigma^2}\right) - \log \sum_{G_q \in \Pi_{-k}} \exp\left(-\frac{D_{Qq}}{2\sigma^2}\right) & k = 1, 3, 5 \end{cases}$$

Equation (4)

$$D_{Ip}=(X_I-G_p)^2 \quad p=1,\ldots,8$$

$$D_{Qp}=(X_Q-G_p)^2 \quad p=1,\ldots,8 \qquad \text{Equation (5)}$$

In addition, Equation (4) can be calculated recursively by defining the following operator:

$$\text{max\_soft}(x,y)=\log(\exp(x)+\exp(y))=\max(x,y)+\log(1+\exp(\text{abs}(x-y))) \qquad \text{Equation (6)}$$

In Equation (6), max(x,y) is the maximum function. The operator defined in Equation (6) may be employed to generate an equivalent expression for Equation (4), as follows:

$$b_k = \begin{cases} \text{max\_soft}\left(\left\{G_p \in \Pi_{+k}\left|-\frac{D_{Ip}}{2\sigma^2}\right.\right\}\right) - \text{max\_soft}\left(\left\{G_q \in \Pi_{-k}\left|-\frac{D_{Iq}}{2\sigma^2}\right.\right\}\right) & k=0,2,4 \\ \text{max\_soft}\left(\left\{G_p \in \Pi_{+k}\left|-\frac{D_{Qp}}{2\sigma^2}\right.\right\}\right) - \text{max\_soft}\left(\left\{G_q \in \Pi_{-k}\left|-\frac{D_{Qq}}{2\sigma^2}\right.\right\}\right) & k=1,3,5 \end{cases} \qquad \text{Equation (7)}$$

Equation (7) can be calculated by applying the two-input max_soft( ) function successively because the max_soft( ) function for multiple inputs can be reduced to the two-input function recursively as follows:

$$\text{max\_soft}(x,y,z)=\log(\exp(x)+\exp(y)+\exp(z))=\text{max\_soft}(\text{max\_soft}(x,y),z)$$

The total number of calculations of the two-input max_soft( ) function is equal to $\sqrt{M}$ per each soft input bit for the example case of an M-ary QAM constellation. In this example, eight max_soft calculations are performed to accommodate the eight different grids and the eight different distance metrics associated with a single received modulation symbol.

As described above, the present invention can utilize different distance metrics for purposes of calculating the soft bits. For instance, the following absolute value metric can be used instead of the Euclidean distance metric in Equation (5) in order to avoid the use of a multiplication operation (associated with the squaring function):

$$D_{Ip}=\text{abs}(X_I-G_p)$$

$$D_{Qp}=\text{abs}(X_Q-G_p). \qquad \text{Equation (8)}$$

Using these distance expressions, the soft input bits are given by $$b_k = \begin{cases} \text{max\_soft}\left(\left\{G_p \in \Pi_{+k}\left|-\frac{D_{Ip}}{\sqrt{2}\,\sigma}\right.\right\}\right) - \text{max\_soft}\left(\left\{G_q \in \Pi_{-k}\left|-\frac{D_{Iq}}{\sqrt{2}\,\sigma}\right.\right\}\right) & k=0,2,4 \\ \text{max\_soft}\left(\left\{G_p \in \Pi_{+k}\left|-\frac{D_{Qp}}{\sqrt{2}\,\sigma}\right.\right\}\right) - \text{max\_soft}\left(\left\{G_q \in \Pi_{-k}\left|-\frac{D_{Qq}}{\sqrt{2}\,\sigma}\right.\right\}\right) & k=1,3,5 \end{cases} \qquad \text{Equation (9)}$$

FIG. 3 is a schematic representation of a practical symbol demapper 300 configured to implement the techniques described above. As described above, demapper 300 receives a modulation symbol (represented by its I and Q components) and generates a soft bit associated with that modulation symbol. A signal energy estimation block 302 estimates the modulation symbol energy either with the aid of a pilot signal or in a decision-directed way. In a typical implementation, signal energy estimation block 302 may be a separate processing component associated with the receiver section. There are numerous known techniques regarding the manner in which the symbol energy is estimated. Estimation block 302 cooperates with a pre-scale element 304 such that the average energy of the received modulation symbol is approximately equal to the constellation energy.

The output of pre-scale element 304 may be directed to a distance block 306, which is configured to calculate a suitable distance metric (e.g., by performing the calculation of Equation 5 or Equation 8) using the scaled modulation symbols and constellation grid points. In a practical embodiment, the calculation of the distance metrics can be accomplished in an efficient manner using a subtractor and either a multiplier (for the Euclidean distance measurement) or a sign conversion element (for the absolute value distance measurement). In this respect, distance block 306 interacts with the known constellation points 308, which may be stored in a suitable memory element, look-up table, or the like. The number of distance metrics that have to be calculated for a real or an imaginary part of each modulation symbol is equal to the square root of M (in this example, the number of distance metrics equals eight). The calculated distance metrics for the current modulation symbol are stored in a buffer element 310. An appropriate multiplexer 312 is suitably controlled such that the stored distance metrics are passed on for processing at the proper time. Multiplexer 312 makes the selected distance metrics available to a post-scale element 316.

Similar to the signal energy estimation block 302, symbol demapper preferably cooperates with a $\sigma^2$ (noise variance) estimation block 314. Estimation block 314, which may be realized as a separate component of the receiver section, estimates the noise energy either with the aid of a pilot signal or in a decision-directed way. Along with the post-scale element 316, the $\sigma^2$ estimation block 314 scales the distance metric according to channel reliability. In other words, post-scale element 316 performs the division operation associated with the distance measurement expressions in Equations 7 and 9. In the preferred embodiment, post-scale element 316 also performs the sign inversion associated with the distance metric operand in the max_soft operation (see Equations 7 and 9).

The output of post-scale element 316 is routed to a max_soft processing element 318. Processing element 318 is preferably configured to calculate the two-input max_soft( ) function in Equation (6). The max_soft processing element 318 can be implemented in a memory element or as a combinatorial logic circuit. In a practical embodiment, processing element 318 can be easily realized with a comparator element (for determining the maximum function) and a look-up table (for determining the logarithmic expression in the max_soft operator).

In operation, max_soft processing element 318 receives one input from the distance metric buffer 310 though multiplexer 312 and a second input from the previous iteration of the max_soft operation, thus enabling a recursive calculation. With respect to the first iteration of the max_soft operation in connection with a soft bit calculation, max_soft processing element 318 is bypassed in a suitable manner. For example, max_soft processing element may be bypassed via a second multiplexer 319. As shown in FIG. 3, second multiplexer 319 can be suitably controlled by a control element 330 such that, for the first iteration, second multiplexer 319 selects the "1" input, thus passing the output of post-scale element 316 directly to a delay element 320.

Symbol demapper 300 utilizes delay element 320 to facilitate the recursive calculation. In the example system described herein, the max_soft processing element 318 completes four iterations for the grids associated with $\Pi_{+k}$, followed by four iterations for the grids associated with $\Pi_{-k}$. As discussed above, delay element 320 is used to provide the result of a previous iteration to the max_soft processing element 318. The result of the first four iterations of the max_soft operation is saved during the next four iterations. In this respect, a delay element 322 may be utilized by symbol demapper 300 to facilitate this iterative computation and the saving of the results for the grids associated with $\Pi_{+k}$. Finally, a subtraction element 324 and a delay element 326 completes the soft bit calculation in Equation (7) or Equation (9). The subtraction element 324 receives the stored result associated with the first set of iterations for the grids associated with $\Pi_{+k}$, and subtracts the result associated with the second set of iterations for the grids associated with $\Pi_{-k}$.

The multiplexer control methodology described above may be implemented by control element 330 in accordance with the following generalized pseudo-code:

```
for k=1 to log₂(M)           % for each bit
    for i=1 to 0.5(sqrt(M))   % recursion for Π₊ₖ,ᵢ
        MUX1 = index (Π₊ₖ,ᵢ); % choose corresponding
                                distance metric
        if i=1
            MUX2 = 1;         % initial condition for recursion
        else
            MUX2 = 0;         % recursion
        end;
        latch 1;              % recursion
    end;
    latch 2;
    for i=1 to 0.5(sqrt(M))   % recursion for Π₋ₖ,ᵢ
        MUX1 = index (Π₋ₖ,ᵢ); % choose corresponding
                                distance metric
        if i=1
            MUX2 = 1;
        else
            MUX2 = 0;
        end;
        latch 1;
    end;
    latch 3;                  % final output or soft bit
end;
```

For purposes of this methodology, an example multiplexer control pattern is set forth in Table 2 below.

TABLE 2

| | MUX1 Control Pattern | | | | | | | |
|---|---|---|---|---|---|---|---|---|
| | Index ($\Pi_{+k,i}$) | | | | Index ($\Pi_{-k,i}$) | | | |
| k | i = 1 | i = 2 | i = 3 | i = 4 | i = 1 | i = 2 | i = 3 | i = 4 |
| 0, 1 | 5 ($C_1$) | 6 ($C_2$) | 7 ($C_3$) | 8 ($C_4$) | 4 ($-C_1$) | 3 ($-C_2$) | 2 ($-C_3$) | 1 ($-C_4$) |
| 2, 3 | 5 ($C_1$) | 4 ($-C_1$) | 6 ($C_2$) | 3 ($-C_2$) | 7 ($C_3$) | 2 ($-C_3$) | 8 ($C_4$) | 1 ($-C_4$) |
| 4, 5 | 6 ($C_2$) | 3 ($-C_2$) | 7 ($C_3$) | 2 ($-C_3$) | 5 ($C_1$) | 4 ($-C_1$) | 8 ($C_4$) | 1 ($-C_4$) |

Figure 4:
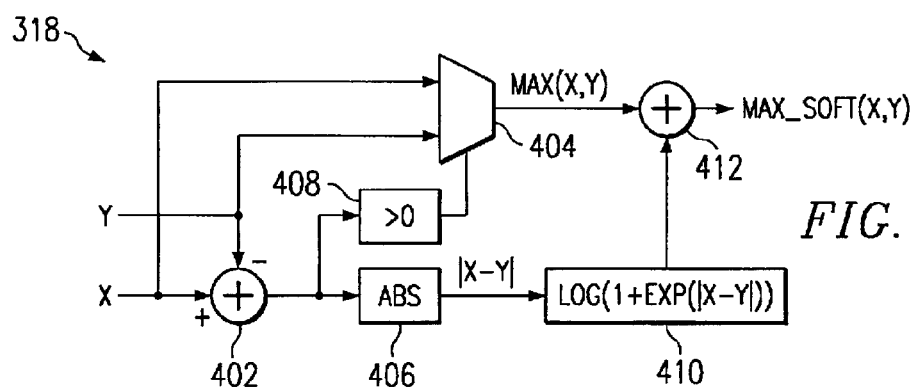
FIG. 4 is a schematic representation of an example implementation of an operator utilized in the symbol demapper shown in FIG. 3.

FIG. 4 is a schematic block diagram of one suitable implementation of max_soft processing element 318. As described above, processing element 318 is configured to carry out the max_soft operation set forth in Equation 6. As expressed in Equation 6, processing element 318 operates on an x input value and a y input value. In the context of the practical operands described herein, the x and y operands are equivalent to $$-\frac{D_{Ip}}{2\sigma^2} \text{ and } -\frac{D_{Qp}}{2\sigma^2}$$

(for Equation 7) and $$-\frac{D_{Ip}}{\sqrt{2}\,\sigma} \text{ and } -\frac{D_{Qp}}{\sqrt{2}\,\sigma}$$

for Equation 9). Thus, as mentioned above, the preferred embodiment processes four instances of $$-\frac{D_{Ip}}{2\sigma^2}$$

for $\text{II}_{+k}$ and four instances of $$-\frac{D_{lp}}{2\sigma^2}$$

for $\text{II}_{-k}$ for any given value of k.

Processing element 318 includes a summer 402, which subtracts the y input value from the x input value. The x and y values are also used as inputs to a multiplexer 404. The value of (x−y) is fed to an absolute value block 406 and a comparator block 408. Absolute value block 406 generates the absolute value of the difference, while comparator block 408 determines whether the difference is greater than zero. The output of comparator block 408 serves as a control signal for multiplexer 404. Thus, if the difference is greater than zero, multiplexer 404 selects the x value. Otherwise, the multiplexer 404 selects the y value. In this manner, multiplexer 404 suitably selects the maximum value between the x and y values.

The absolute value of the difference (as generated by absolute value block 406) serves as an input to a look-up table 410, which represents the operation: log (1+exp (abs (x−y)). Look-up table 410 may be easily implemented as a storage element that contains a number of computed values. The output of look-up table 410 and the output of multiplexer 404 are added in a summer 412. Summer 412 functions to perform the final addition operation in Equation 6.

Ultimately, the number of computations and the complexity of the processing is much less than the log-likelihood ratio calculation of Equation 1. Similar to the calculation of Equation 1, a symbol demapper according to the present invention generates an "exact" representation of the log-likelihood ratio without relying on estimates or approximations.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention.

What is claimed is:

1. A method for processing symbols for a soft input decoder comprising the steps of:
   (a) receiving a modulation symbol having I and Q components; and
   (b) converting the received modulation symbol into a soft bit, $b_K$, by calculating the following:

$$b_k = \begin{cases} \log \sum_{G_p \in \Pi_{+k}} \exp\left(-\frac{D_{Ip}}{2\sigma^2}\right) - \log \sum_{G_q \in \Pi_{-k}} \exp\left(-\frac{D_{Iq}}{2\sigma^2}\right) & k = 0, 2, 4 \\ \log \sum_{G_p \in \Pi_{+k}} \exp\left(-\frac{D_{Qp}}{2\sigma^2}\right) - \log \sum_{G_q \in \Pi_{-k}} \exp\left(-\frac{D_{Qq}}{2\sigma^2}\right) & k = 1, 3, 5 \end{cases}$$

where $\sigma^2$ is the noise variance associated with the channel, exp( ), $\Pi_{+k}$ and $\Pi_{-k}$ represent decoupled sets of constellation points associated with the I and Q components, $D_{Ip}$ and $D_{Qp}$ represent a distance metric, measurement, or calculation associated with the distance between the received modulation symbol and a grid or group of points in the given constellation, and $G_p$ and $G_q$ are constellation grids.

2. A method as defined in claim 1, wherein $D_{Ip}$ and $D_{Qp}$ are calculated using a Euclidean distance measurement.

3. A method as defined in claim 2, wherein $D_{Ip}$ and $D_{Qp}$ are calculated using an absolute value measurement.

4. A method as defined in claim 1, wherein step (b) is performed recursively by performing the following steps:

defining the following operator:

max_soft(x,y)=log(exp(x)+exp(y))=max(x,y)+log(1+exp(abs(x−y)))

where max (x,y) is the maximum function, and performing the following equation:

$$b_k = \begin{cases} \max\_\text{soft}\left(\left\{G_p \in \Pi_{+k} \middle| -\frac{D_{Ip}}{2\sigma^2}\right\}\right) - \max\_\text{soft}\left(\left\{G_q \in \Pi_{-k} \middle| -\frac{D_{Iq}}{2\sigma^2}\right\}\right) & k = 0, 2, 4 \\ \max\_\text{soft}\left(\left\{G_p \in \Pi_{+k} \middle| -\frac{D_{Qp}}{2\sigma^2}\right\}\right) - \max\_\text{soft}\left(\left\{G_q \in \Pi_{-k} \middle| -\frac{D_{Qq}}{2\sigma^2}\right\}\right) & k = 1, 3, 5 \end{cases}$$

in order to calculate the soft bit, $b_K$.

5. A method as defined in claim 4, wherein $D_{Ip}$=abs($X_I$−$G_p$) $D_{Qp}$=abs($X_Q$−$G_p$).

6. A method as defined in claim 5, wherein the following formula:

$$b_k = \begin{cases} \max\_\text{soft}\left(\left\{G_p \in \Pi_{+k} \middle| -\frac{D_{Ip}}{\sqrt{2}\sigma}\right\}\right) - \max\_\text{soft}\left(\left\{G_q \in \Pi_{-k} \middle| -\frac{D_{Iq}}{\sqrt{2}\sigma}\right\}\right) & k = 0, 2, 4 \\ \max\_\text{soft}\left(\left\{G_p \in \Pi_{+k} \middle| -\frac{D_{Qp}}{\sqrt{2}\sigma}\right\}\right) - \max\_\text{soft}\left(\left\{G_q \in \Pi_{-k} \middle| -\frac{D_{Qq}}{\sqrt{2}\sigma}\right\}\right) & k = 1, 3, 5 \end{cases}$$

is used to calculate the soft bit, $b_K$.

7. A method as defined in claim 1, wherein step (b) is performed by a symbol demapper.

8. A method as defined in claim 7, wherein the symbol demapper comprises a quadrature amplitude modulation (QAM) demapper.

9. A symbol demapper for processing a modulation symbol having I and Q components and converting the received modulation symbol into a soft bit, $b_K$, the symbol demapper comprising:

an input port for receiving the modulation symbol; and a circuit coupled to the input port for calculating the soft bit using the following formula:

$$b_k = \begin{cases} \log \sum_{G_p \in \Pi_{+k}} \exp\left(-\frac{D_{Ip}}{2\sigma^2}\right) - \log \sum_{G_q \in \Pi_{-k}} \exp\left(-\frac{D_{Iq}}{2\sigma^2}\right) & k = 0, 2, 4 \\ \log \sum_{G_p \in \Pi_{+k}} \exp\left(-\frac{D_{Qp}}{2\sigma^2}\right) - \log \sum_{G_q \in \Pi_{-k}} \exp\left(-\frac{D_{Qq}}{2\sigma^2}\right) & k = 1, 3, 5 \end{cases}$$

where $\sigma^2$ is the noise variance associated with the channel, exp( ), $\Pi_{+k}$ and $\Pi_{-k}$ represent decoupled sets of constellation points associated with the I and Q components, $D_{Ip}$ and $D_{Qp}$ represent a distance metric, measurement, or calculation associated with the distance between the received modulation symbol and a grid or group of points in the given constellation, and $G_p$ and $G_q$ are constellation grids.

10. A symbol demapper as defined in claim 9, further comprising:

a distance metric circuit coupled to the input port that calculates $D_{Ip}$ and $D_{Qp}$ using a Euclidean distance measurement.

11. A symbol demapper as defined in claim 9, further comprising:

a distance metric circuit coupled to the input port that calculates $D_{Ip}$ and $D_{Qp}$ using an absolute value measurement.

12. A symbol demapper as defined in claim 9, wherein the soft symbol demapper comprises a quadrature amplitude modulation (QAM) demapper.

13. A symbol demapper as defined in claim 9, further comprising:

a distance circuit coupled to the input, the distance metric circuit providing distance metrics related to the modulation symbol; and a max soft processing circuitry coupled to the distance circuit for using the following operator:

max_soft(x,y)=log(exp(x)+exp(y))=max(x,y)+log(1+exp(abs(x−y)))

where max (x,y) is the maximum function, and performing the following equation recursively:

$$b_k = \begin{cases} \max\_\text{soft}\left(\left\{G_p \in \Pi_{+k} \left| -\frac{D_{Ip}}{2\sigma^2}\right.\right\}\right) - \max\_\text{soft}\left(\left\{G_q \in \Pi_{-k} \left| -\frac{D_{Iq}}{2\sigma^2}\right.\right\}\right) & k = 0, 2, 4 \\ \max\_\text{soft}\left(\left\{G_p \in \Pi_{+k} \left| -\frac{D_{Qp}}{2\sigma^2}\right.\right\}\right) - \max\_\text{soft}\left(\left\{G_q \in \Pi_{-k} \left| -\frac{D_{Qq}}{2\sigma^2}\right.\right\}\right) & k = 1, 3, 5 \end{cases}$$

in order to calculate the soft bit, $b_K$.

* * * * *